United States Patent
Nishizawa (10) Patent No.: US 10,847,549 B2
(45) Date of Patent: Nov. 24, 2020

(54) THIN-FILM TRANSISTOR ARRAY AND METHOD FOR PRODUCING THE SAME

(71) Applicant: TOPPAN PRINTING CO., LTD., Taito-ku (JP)

(72) Inventor: Makoto Nishizawa, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 16/529,003

(22) Filed: Aug. 1, 2019

(65) Prior Publication Data

US 2019/0363105 A1  Nov. 28, 2019

Related U.S. Application Data (63) Continuation of application No. PCT/JP2018/003676, filed on Feb. 2, 2018.

(30) Foreign Application Priority Data

Feb. 15, 2017  (JP) ................. 2017-026005

(51) Int. Cl.
  *H01L 27/12*    (2006.01)
(52) U.S. Cl.
  CPC ........ *H01L 27/124* (2013.01); *H01L 27/1248* (2013.01); *H01L 27/1259* (2013.01)
(58) Field of Classification Search
  CPC .............. H01L 27/124; H01L 27/1248; H01L 51/0545; H01L 27/1214; H01L 2021/775;
  (Continued)

(56) References Cited

U.S. PATENT DOCUMENTS

2008/0197348 A1* 8/2008 Matsubara ............ H01L 27/283
   257/40
2012/0292717 A1* 11/2012 Gelinck ................ H01L 27/283
   257/401

(Continued)

FOREIGN PATENT DOCUMENTS

JP    2005-210086 A    8/2005
JP    2006-63334 A     3/2006
(Continued)

OTHER PUBLICATIONS

International Search Report dated Apr. 10, 2018 in PCT/JP2018/003676, filed Feb. 2, 2018 (with English Translation).

*Primary Examiner* — Nelson Garces
(74) *Attorney, Agent, or Firm* — Oblon, McClelland, Maier & Neustadt, L.L.P.

(57) ABSTRACT

A thin film transistor array including thin film transistor elements including an insulating substrate, a gate electrode, a gate insulating film, a source electrode, a drain electrode, and a channel region formed between the source electrode and the drain electrode, the thin film transistor elements being arrayed in a matrix, a disconnection pattern including an insulating material and formed in stripes extending over the thin film transistor elements, the disconnection pattern having a maximum film thickness of 200 nm-3000 nm, and a semiconductor pattern formed in stripes perpendicular to the disconnection pattern and extending over the channel region of the thin film transistor elements, the semiconductor pattern being disconnected at an intersection with the disconnection pattern.

18 Claims, 11 Drawing Sheets

(58) Field of Classification Search
CPC ............. H01L 27/1251; H01L 51/0014; H01L 29/78669; H01L 29/78678; H01L 29/66765; H01L 29/78648; H01L 27/283; H01L 27/3274; H01L 27/3246; H01L 27/3283; H01L 27/3295
See application file for complete search history.

(56) References Cited

U.S. PATENT DOCUMENTS

| | | | | |
|---|---|---|---|---|
| 2013/0056834 A1* | 3/2013 | Gwoziecki | ............... | H01L 27/28 257/401 |
| 2014/0042419 A1* | 2/2014 | Okumoto | ............ | H01L 27/3274 257/40 |
| 2015/0129862 A1* | 5/2015 | Murata | ............... | H01L 27/1248 257/40 |

FOREIGN PATENT DOCUMENTS

| | | | |
|---|---|---|---|
| JP | 2008-235861 A | | 10/2008 |
| JP | 2015065390 A | * | 4/2015 |
| JP | 2015-207704 A | | 11/2015 |

* cited by examiner

THIN-FILM TRANSISTOR ARRAY AND METHOD FOR PRODUCING THE SAME

CROSS-REFERENCE TO RELATED APPLICATIONS

The present application is a continuation of International Application No. PCT/JP2018/003676, filed Feb. 2, 2018, which is based upon and claims the benefits of priority to Japanese Application No. 2017-026005, filed Feb. 15, 2017. The entire contents of all of the above applications are incorporated herein by reference.

BACKGROUND OF THE INVENTION

Field of the Invention

The present invention relates to a thin-film transistor array and a method for producing the same.

Discussion of the Background

In recent years, research and development on printed electronics, which is a printing method for producing elements having functional properties by using a functional material in the form of organic or inorganic ink, have been actively conducted.

In printed electronics, organic functional elements such as organic electroluminescence (EL) elements, organic solar batteries, and organic thin film transistors have particularly been developed. For these organic functional elements, it is usually necessary to pattern an organic function layer having a film thickness of the order of several nm to several μm on a substrate.

Various printing methods have been used in the field of printed electronics. Besides the typical traditional methods such as relief printing, intaglio printing, planographic printing, and stencil printing, there are relatively new methods, which include ink-jetting. These methods are appropriately selected depending on the ink and substrate to be used. Relief printing, intaglio printing, planographic printing, and stencil printing, which involve fabrication and use of a plate for an intended print pattern, are called plate printing. On the other hand, ink-jetting, which does not involve use of a plate regardless of how the pattern is formed, and is performed by directly transferring ink onto a desired position, is called plateless printing.

These printing methods are further subdivided by the members used. For example, in relief printing, a printing method using a printing plate called a flexographic plate, which is made of resin, rubber, or the like, is also referred to as flexographic printing for distinction from others.

In addition, there are relatively simple film formation methods such as spin coating, bar coating, projection coating, and dip coating. In general, these are advantageous for uniform film formation on the entire or substantially entire surface of the substrate. However, they are not suitable for functional elements, which often require precise patterning and individual coating of materials.

Thus, although a variety of methods are in general included in a printing method, it is required in printed electronics to select an appropriate printing method based on the advantages and disadvantages in view of intended structures, materials, and functions.

Relief printing, particularly flexographic printing, is advantageous in printed electronics in that it enables stable continuous printing, wide selection of ink, printing with relatively low viscosity ink, and reduction of damage to the substrate due to use of a soft plate.

Application of relief printing to the field of printed electronics will now be described with an example of organic semiconductors using organic semiconductor ink, which has been recently attracting attention. For example, in relief printing, a technique for forming an organic semiconductor layer by using flexographic printing has been already developed (see PTL 1).

Figure 11:
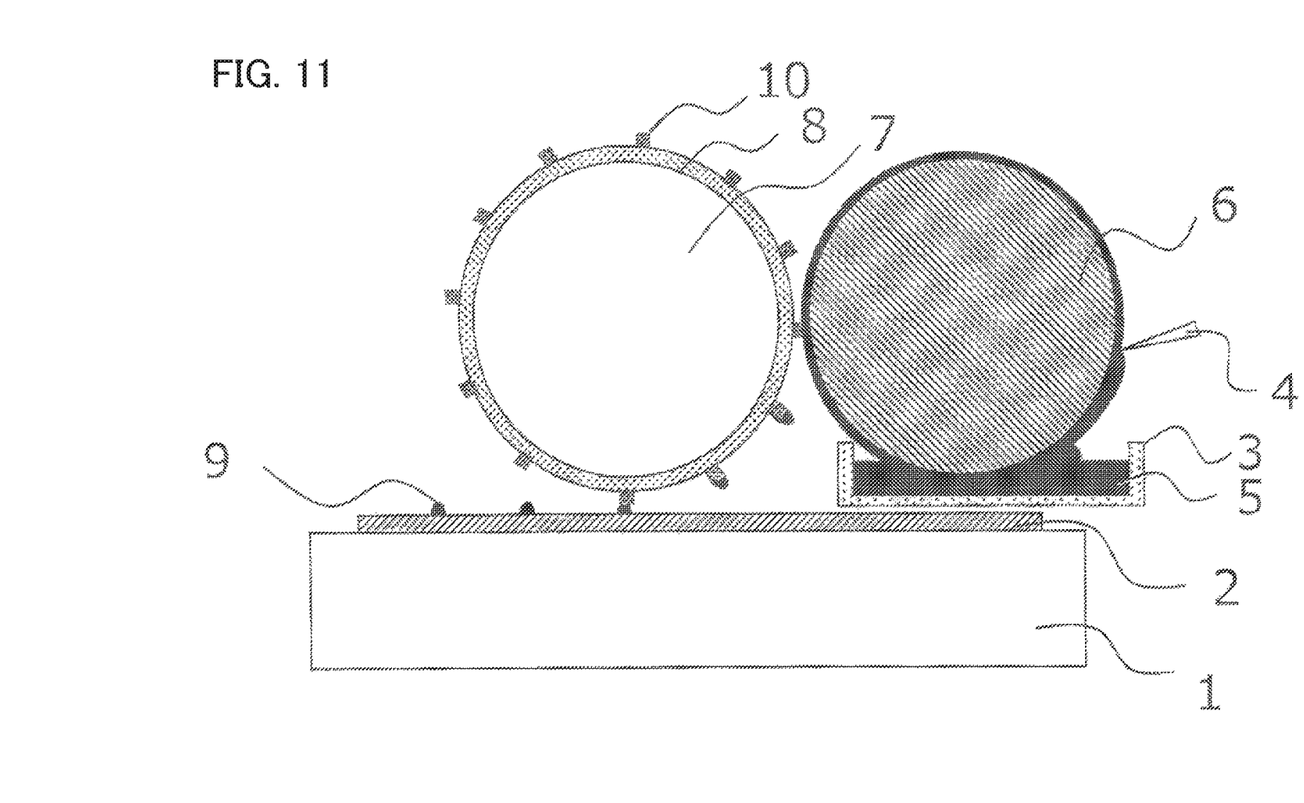
FIG. 11 is a schematic view illustrating an exemplary configuration of a typical relief printing apparatus.

Referring to FIG. 11, an example of a relief printing apparatus will be described. The relief printing apparatus shown in FIG. 11 includes a rotary plate cylinder 7 on which a print relief plate 8 is mounted, an anilox roll 6 for supplying ink 5 onto a plate surface of the relief plate 8, an ink chamber 3 for supplying the ink 5 to the anilox roll 6, a doctor blade 4 for scraping excess of ink on the anilox roll, and a substrate plate 1 on which a printing substrate 2 is placed. The doctor blade 4 is typically a blade such as a metal plate or resin plate, or a roll provided with a resin or rubber formed on the outer periphery.

When individual patterns such as dots are formed by flexographic printing, the film thickness and the shape of printed products often vary since they are strongly affected by a flow of ink on the plate, or dryness. Accordingly, a technique of forming an organic semiconductor layer in a stripe shape extending over a plurality of channels has been studied (see PTL 2).

PTL 1: JP 2006-63334 A
PTL 2: JP 2008-235861 A
PTL 3: JP 2005-210086 A
PTL 4: JP 2015-207704 A

SUMMARY OF THE INVENTION

According to an aspect of the present invention, a thin film transistor array includes thin film transistor elements including an insulating substrate, a gate electrode, a gate insulating film, a source electrode, a drain electrode, and a channel region formed between the source electrode and the drain electrode, the thin film transistor elements being arrayed in a matrix, a disconnection pattern including an insulating material and formed in stripes extending over the thin film transistor elements, the disconnection pattern having a maximum film thickness of 200 nm-3000 nm, and a semiconductor pattern formed in stripes perpendicular to the disconnection pattern and extending over the channel region of the thin film transistor elements, the semiconductor pattern being disconnected at an intersection with the disconnection pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

With reference to the drawings, embodiments of the present invention will now be described. Throughout the embodiments, the same or corresponding components are denoted by the same reference signs, and duplicated description thereof will be omitted.

Figure 1A:
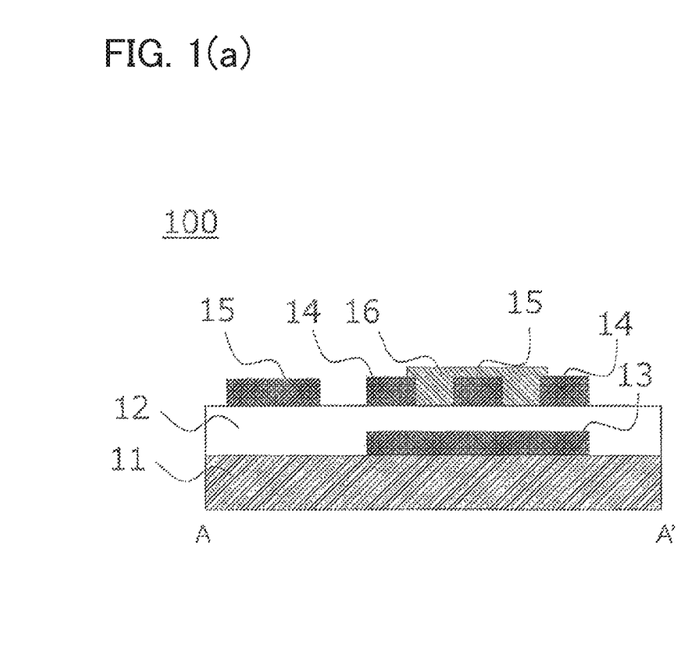
FIGS. 1(a) and 1(b) are schematic views illustrating an exemplary configuration of a typical thin film transistor element.
Figure 1B:
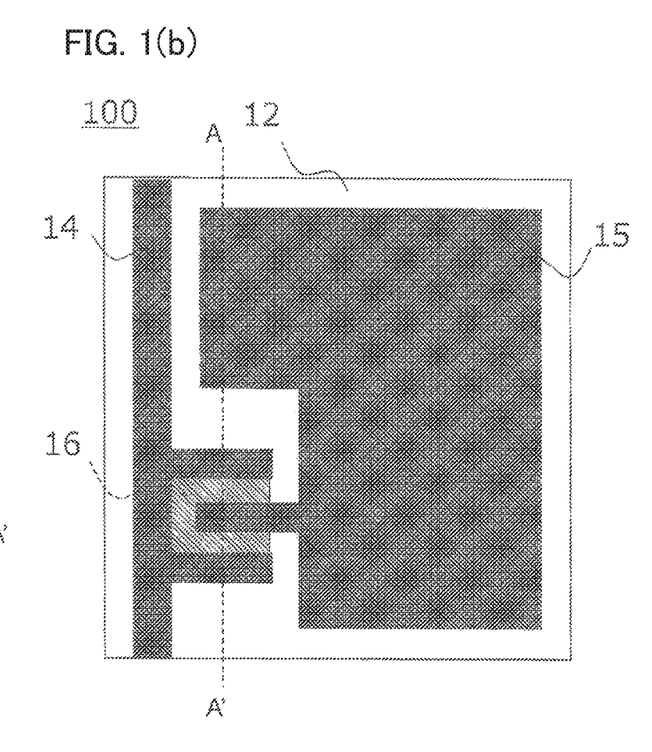
Figure 2:
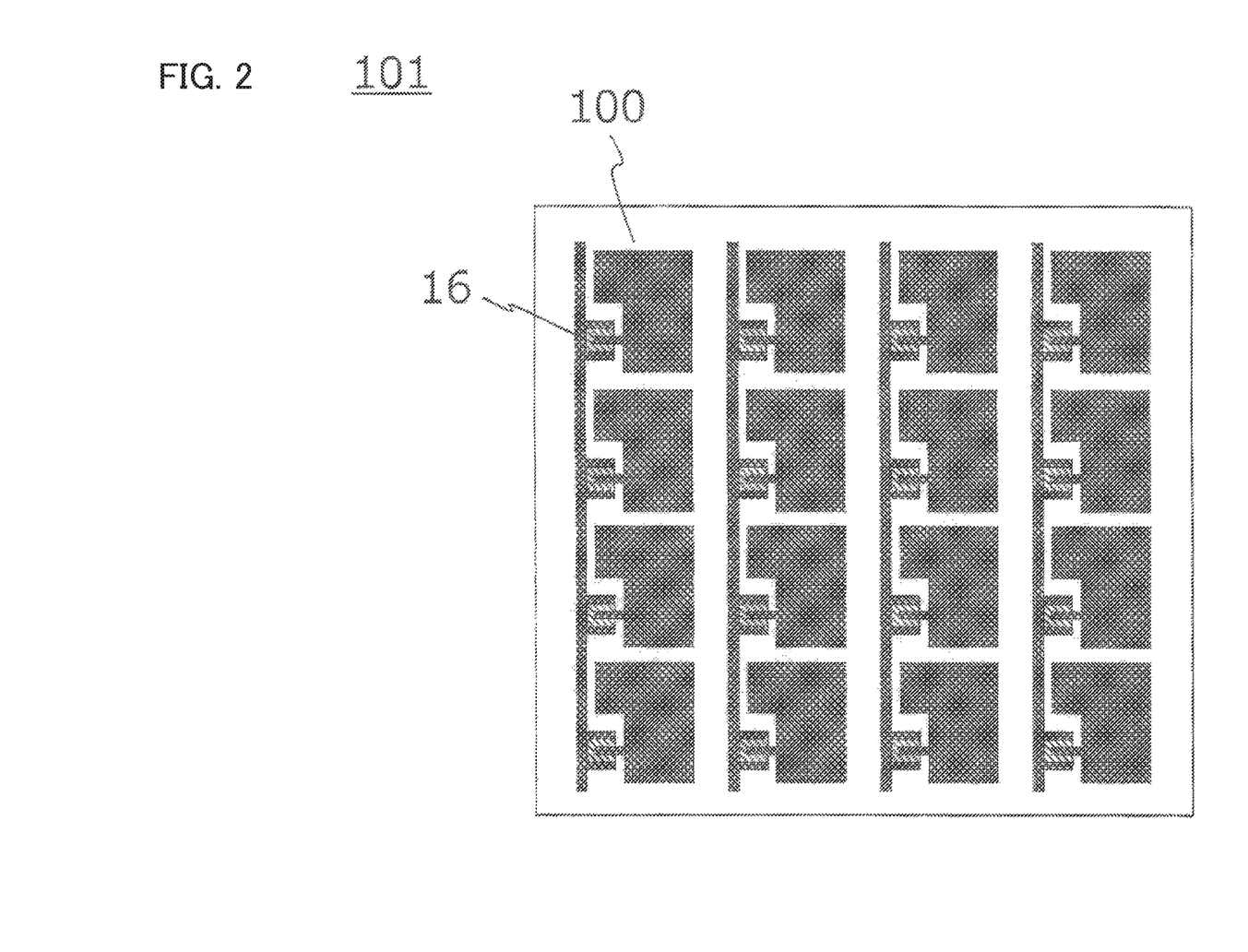
FIG. 2 is a schematic view illustrating an exemplary configuration of a typical thin film transistor array.

FIGS. 1(a) and 1(b) illustrate a typical thin film transistor element 100, and FIG. 2 illustrates a thin film transistor array 101 in which a plurality of thin film transistor elements 100 are arrayed in a matrix. FIG. 1(a) is a cross-sectional view of the thin film transistor element 100, and FIG. 1(b) is a plan view of the thin film transistor element 100. The thin film transistor element 100 includes an insulating substrate 11; a gate electrode 13 and a capacitor electrode (not shown in the figure) which are formed on the insulating substrate 11; and a gate insulating film 12 formed further thereon. In the thin film transistor element 100, a channel region 16' is formed in a layer on the gate insulating film 12 in a region overlapping with the gate electrode 13 in plan view, and a position between a source electrode 14 and a drain electrode 15. Thus, in the thin film transistor element 100, a semiconductor layer 16 is formed in the channel region 16'. If necessary, a protective layer, an interlayer insulating layer, an upper pixel electrode, and the like (not shown in the figure) are formed as a further upper layer.

For example, an ink-jetting method can be used to form a semiconductor layer 16 only in the channel region as shown in FIGS. 1(a) and 1(b). Accordingly, as shown in FIG. 2, the thin film transistor array 101 in which separate semiconductor layers 16 are formed for the respective thin film transistor elements 100 can be produced. However, as described above, forming a semiconductor layer by using an ink-jetting method often causes production process issues.

Figure 3A:
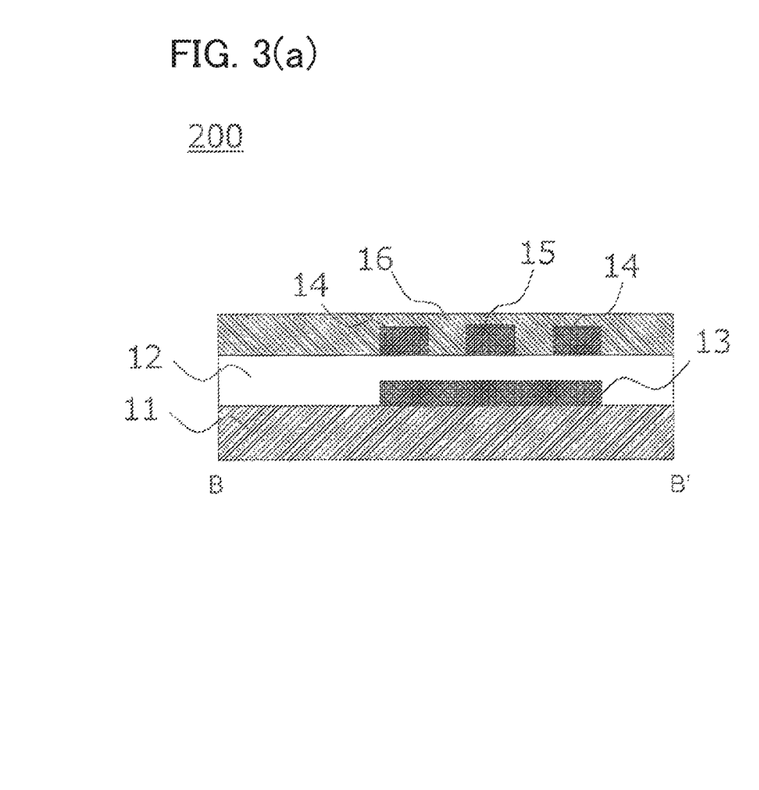
FIGS. 3(a) and 3(b) are schematic views illustrating an exemplary configuration of a typical thin film transistor element.
Figure 3B:
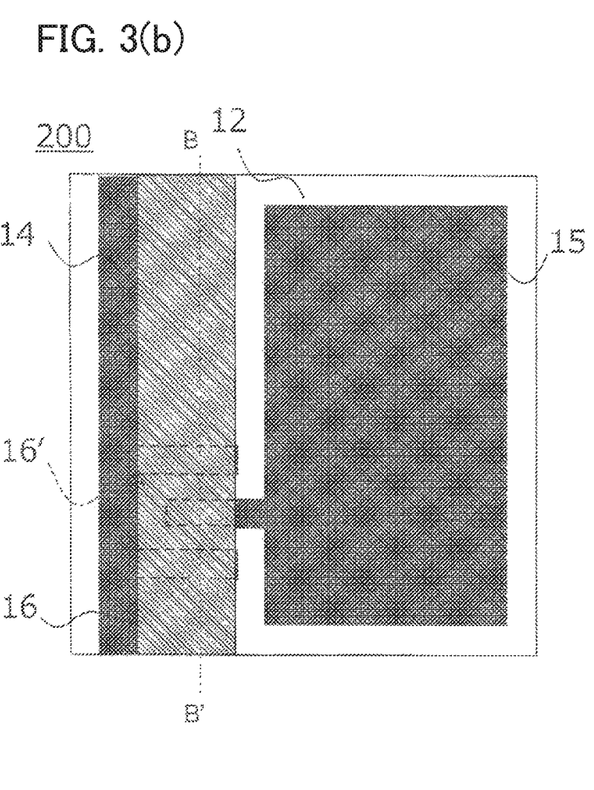
Figure 4:
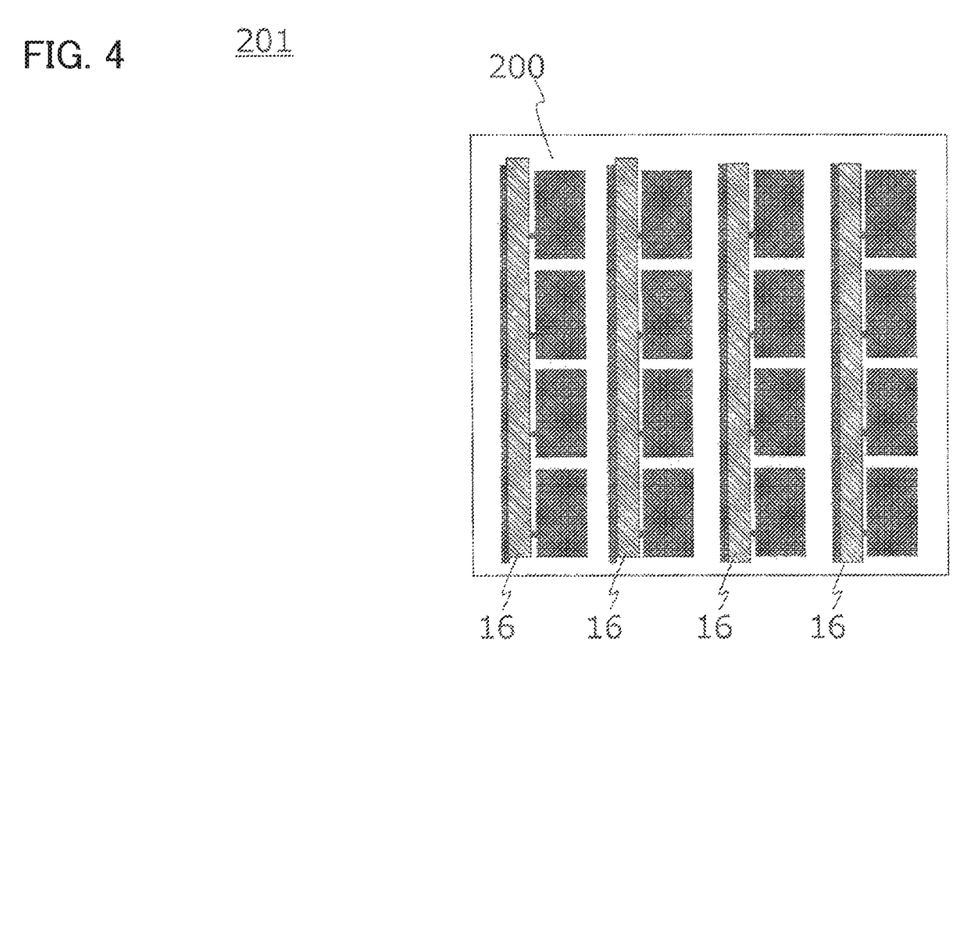
FIG. 4 is a schematic view illustrating an exemplary configuration of a typical thin film transistor array.

FIGS. 3(a) and 3(b) illustrate a thin film transistor element 200 in which the semiconductor layer 16 is formed by stripe printing by using a flexographic printing method, and FIG. 4 illustrates a thin film transistor array 201 in which a plurality of thin film transistor elements 200 are arrayed in a matrix. In this case, the semiconductor layer 16 is formed extending over a plurality of thin film transistor elements 200. With this configuration, although production process issues can be reduced compared with the ink-jetting method, functional issues for the thin film transistor array 201 often become a concern as described above.

Figure 5A:
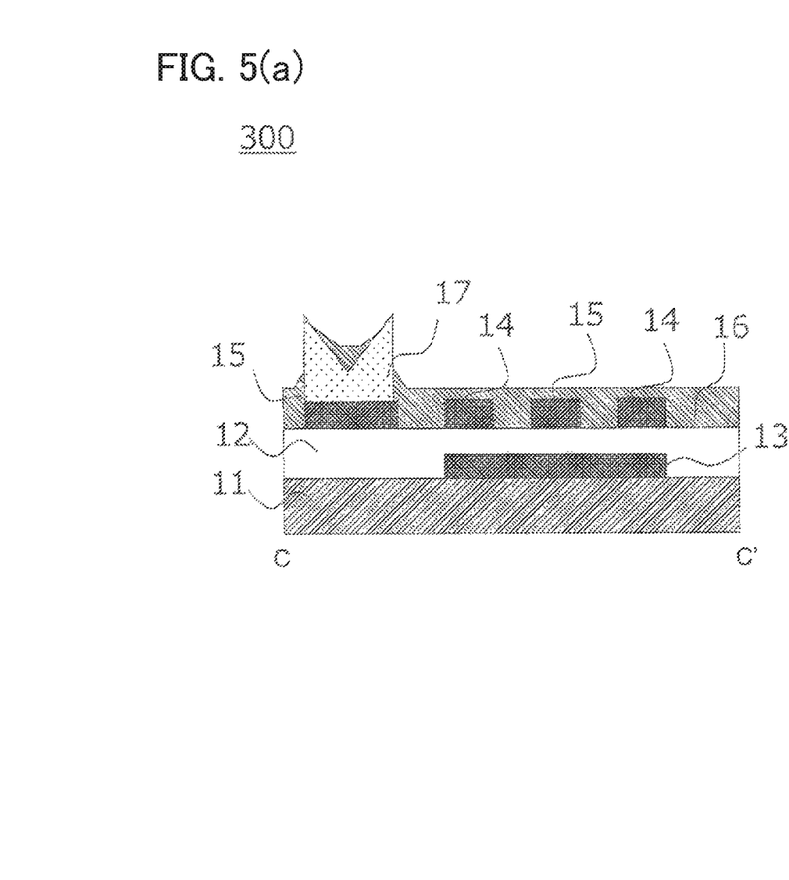
FIGS. 5(a) and 5(b) are schematic views of a thin-film transistor element according to an embodiment of the present invention.
Figure 5B:
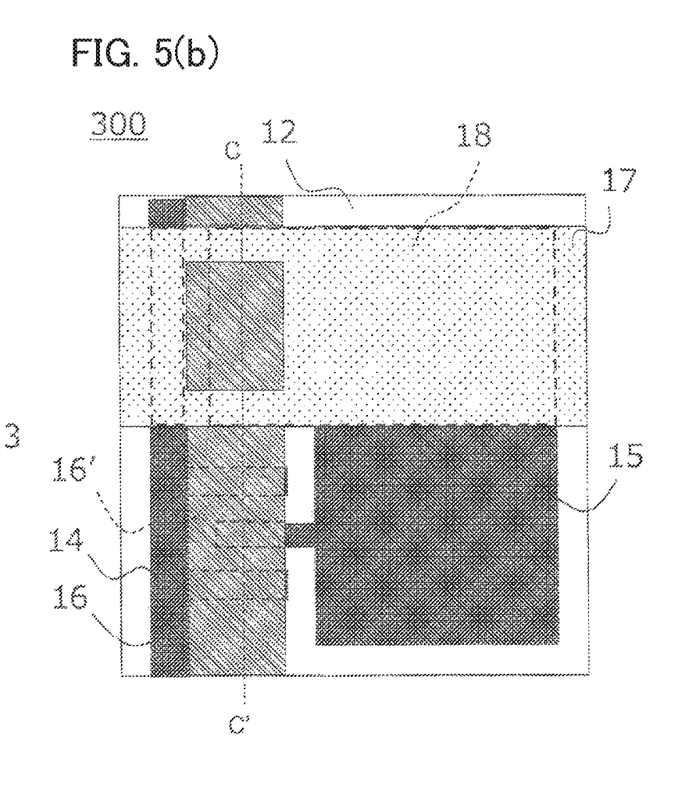
Figure 6:
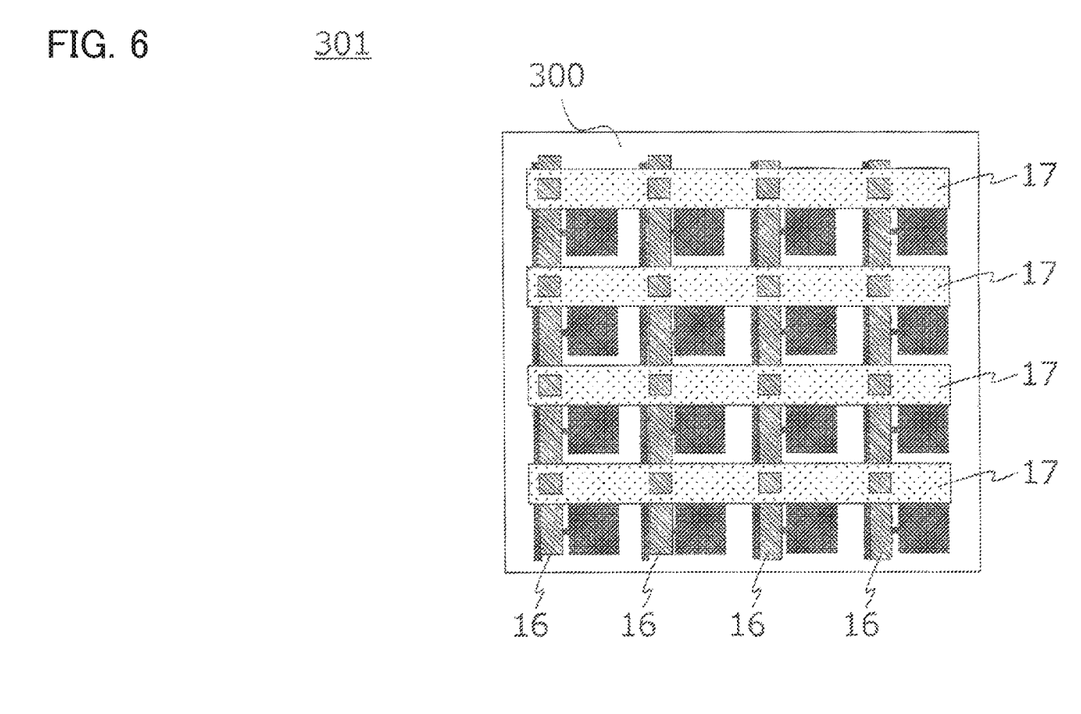
FIG. 6 is a schematic view of a thin-film transistor array according to an embodiment of the present invention.

FIGS. 5(a) and 5(b) illustrate a thin film transistor element 300 according to an embodiment of the present invention, and FIG. 6 illustrates a thin film transistor array 301 in which a plurality of thin film transistor elements 300 are arrayed in a matrix.

As shown in FIGS. 5(a) and 5(b), the thin film transistor element 300 includes: an insulating substrate 11; a gate electrode 13 formed on the insulating substrate 11; a gate insulating film 12 formed extending over the insulating substrate 11 and the gate electrode 13; a source electrode 14 and drain electrodes 15 and 18 formed on the gate insulating film 12; and a channel region 16' formed between the source electrode 14 and the drain electrode 15.

As shown in FIGS. 5(a), 5(b) and 6, the thin film transistor array 301 includes: the thin film transistor arrays 300 arrayed in a matrix; disconnection patterns 17 made of an insulating material and formed in a stripe shape extending over the plurality of thin film transistor elements 300; and the semiconductor patterns 16 formed in a stripe shape perpendicular to the disconnection patterns 17 while extending over the channel regions 16' of the plurality of thin film transistor elements 300, the semiconductor patterns 16 being disconnected at intersections with the disconnection patterns 17. The disconnection pattern 17 has a maximum film thickness of 200 nm or more and 3000 nm or less.

A method for producing the thin film transistor array 301 includes the steps of: forming at least the gate electrode 13, the gate insulating film 12, the source electrode 14, and the drain electrode 15 on the insulating substrate 11; forming a plurality of disconnection patterns 17 by printing an insulating material in a stripe shape on the gate insulating film 12, the source electrode 14, and the drain electrode 15; and forming a plurality of semiconductor patterns 16 by printing in a stripe shape perpendicular to the disconnection patterns 17.

In the step of forming the plurality of semiconductor patterns 16, the semiconductor patterns 16 are physically or electrically disconnected at positions perpendicular to the disconnection patterns 17. Specifically, the semiconductor pattern 16, which is printed perpendicular to the disconnection patterns 17, has portions printed on the gate insulating film 12 and printed on the disconnection pattern 17. Since the disconnection pattern 17 is formed at a predetermined film thickness, a shearing force is applied to the semiconductor pattern 16 in the thickness direction of the thin film transistor array 301 at a position between the two portions (adjacent to the ends of the disconnection pattern 17 in the width direction). As a consequence, the semiconductor pattern 16 is disconnected at positions perpendicular to the disconnection pattern 17, specifically, as shown in FIGS. 5(a) and 5(b), at the ends of the disconnection pattern 17 in the width direction. As shown in FIGS. 5(a), 5(b) and 6, the semiconductor pattern 16 may be partially left on the disconnection pattern 17 after disconnection.

In the thin film transistor array 301, since semiconductor patterns 16, which is formed by stripe printing, are disconnected by the disconnection pattern 17, the thin film transistor elements 300 can be separated from each other. Thus, the thin film transistor array 301 having high design freedom for electrodes, high on/off ratio, and stable transistor properties can be produced with high throughput. Accordingly, both the production process issues and functional issues for the thin film transistor arrays can be resolved.

Materials used for the disconnection pattern 17 are not specifically limited as long as they have sufficient insulating properties. However, if the disconnection pattern 17 has strong liquid repellency to the semiconductor ink, the film thickness of the semiconductor pattern 16 in the extending direction may vary during printing of the semiconductor pattern 16. Therefore, materials used for the disconnection pattern 17 and the semiconductor pattern 16 preferably have high wettability. For a typical organic semiconductor ink, a stable effect can be achieved when a material for the disconnection pattern 17 has a surface energy of 30 mN/m or more.

Further, since the disconnection pattern 17 causes the semiconductor pattern 16 extending over the plurality of thin film transistor elements 300 to be disconnected, the disconnection pattern 17 is required to be formed extending in a direction perpendicular to the extending direction of the semiconductor pattern 16 and have a predetermined film thickness. In general, the film thickness of the semiconductor layer in the organic thin film transistor element is typically 100 nm or less. In this case, it is difficult to form a disconnecting shape if the maximum film thickness of the disconnection pattern 17 is not 200 nm or more. On the other hand, when the semiconductor pattern 16 is formed by a flexographic printing method, the semiconductor ink is not sufficiently in contact with the gate insulating layer 12, leading to poor transfer performance, when the maximum film thickness of the disconnection pattern 17 is more than 3000 nm.

Figure 7:
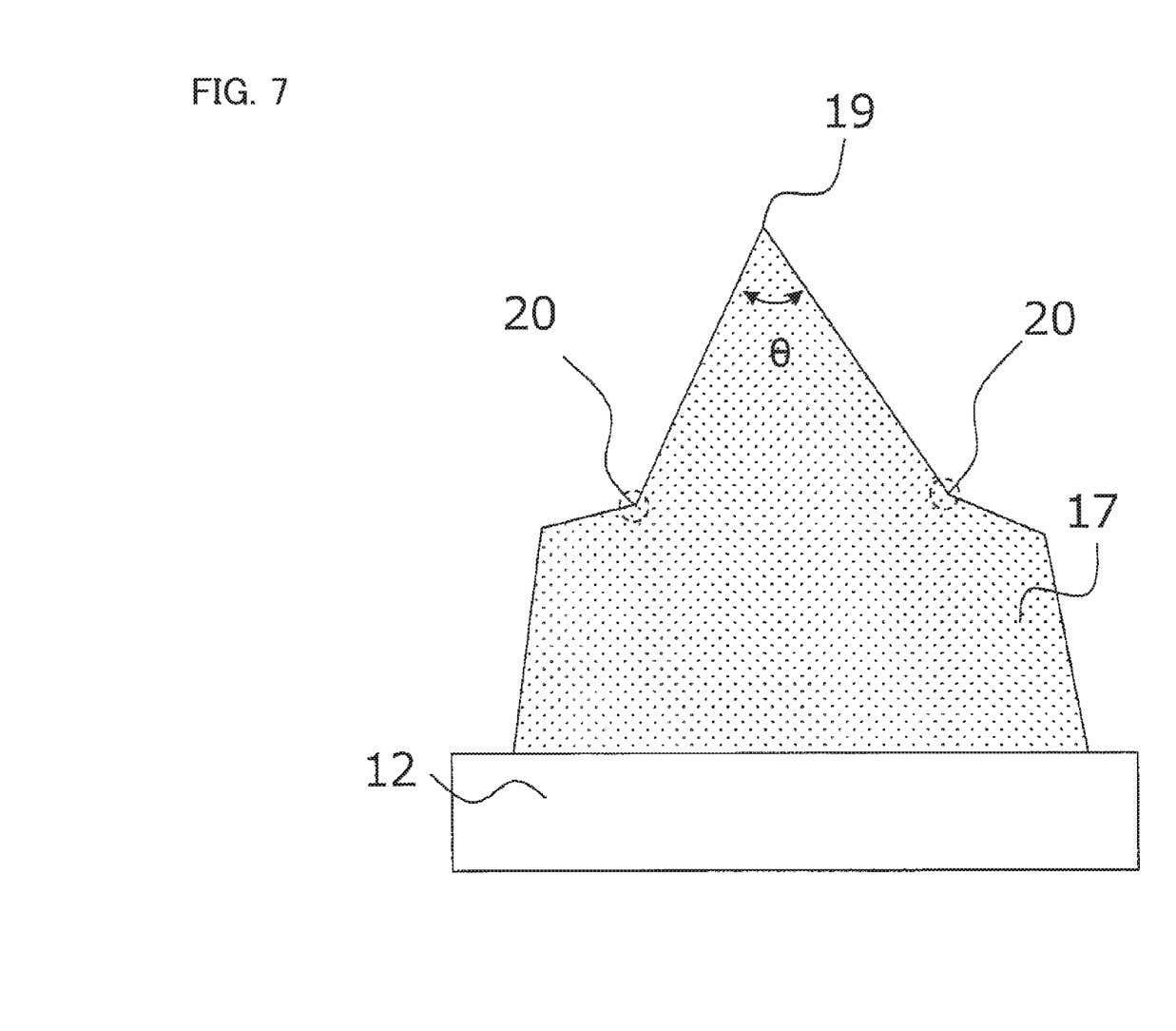
FIG. 7 is a cross-sectional view illustrating an exemplary cross-sectional shape of a disconnection pattern.
Figure 8:
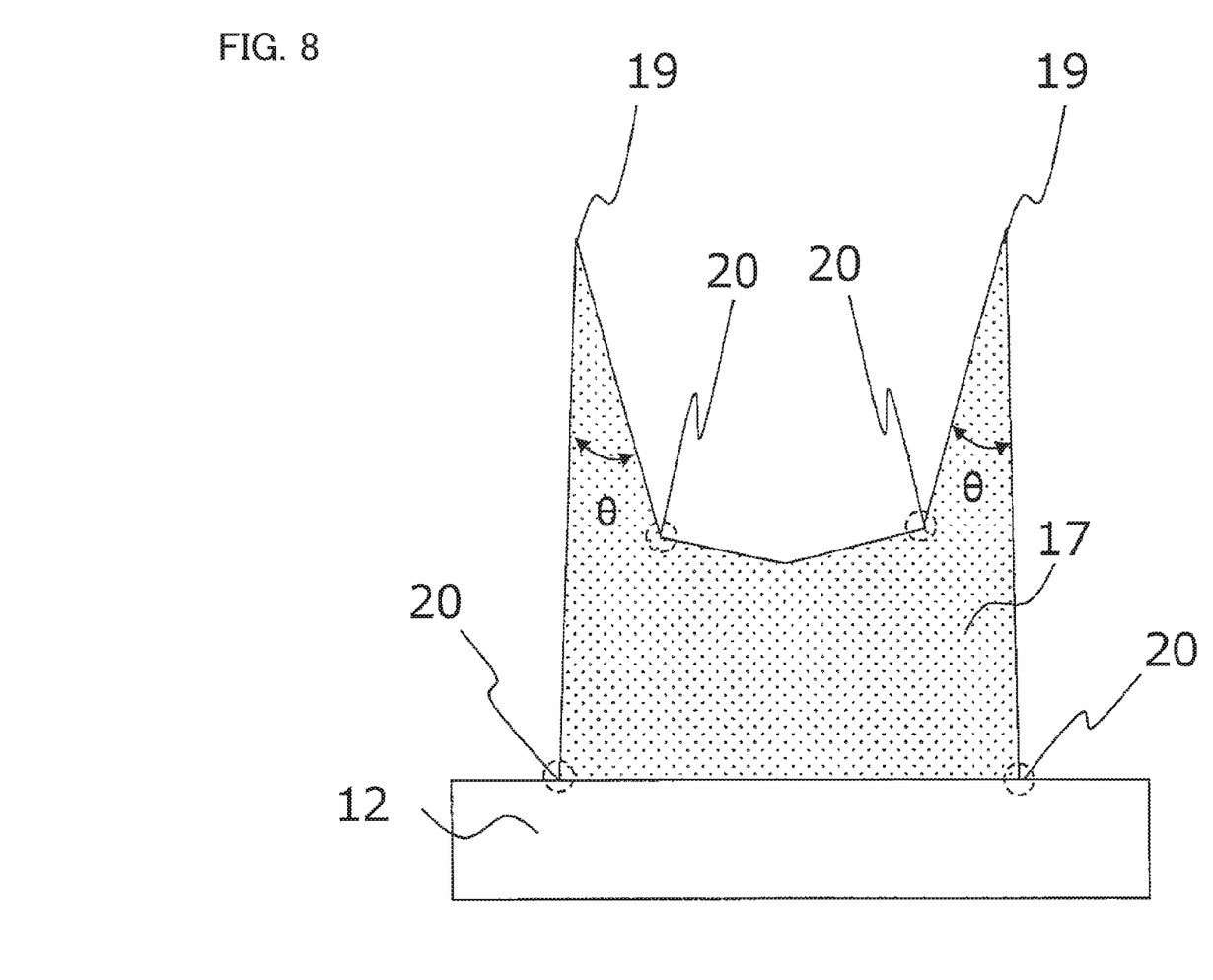
FIG. 8 is a cross-sectional view illustrating an exemplary cross-sectional shape of a disconnection pattern.
Figure 9:
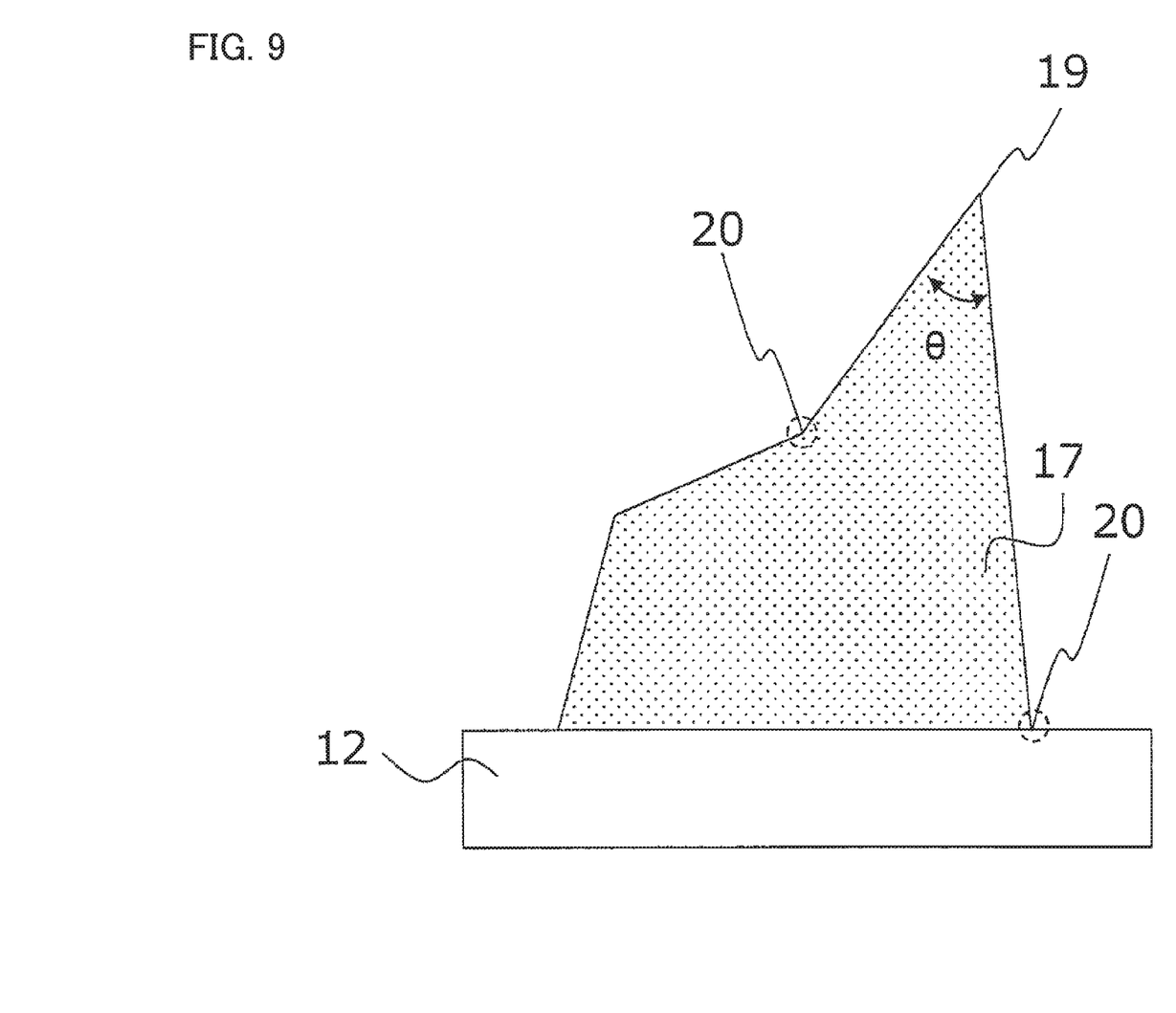
FIG. 9 is a cross-sectional view illustrating an exemplary cross-sectional shape of a disconnection pattern.

Further, when the cross-sectional shape of the disconnection pattern 17 in a direction perpendicular to the extending direction of the disconnection pattern 17 (hereinafter, referred to as a cross-sectional shape for convenience) is a gradual protrusion or a rectangular shape, there is a risk that the semiconductor pattern 16 may not be successfully disconnected. FIGS. 7 to 9 illustrate exemplary cross-sectional shapes of the disconnection pattern 17. As shown in FIGS. 7 to 9, in the cross-sectional shape of the disconnection pattern 17, an angle θ of an apex 19 formed between two inflection points 20 closest to the apex 19 is of importance. (The term inflection point described herein refers to a maximum point of curvature change in the outline of the cross-sectional shape or an end point of the outline of the cross-sectional shape.) That is, in order to ensure disconnection of the semiconductor pattern 16 during production thereof, the angle θ formed between virtual lines connecting the apex 19 and each of the inflection points 20 closest to the apex on both sides of the apex 19 is preferably 100° or less. When the angle is larger than this angle, the semiconductor pattern 16 may partially remain connected depending on the viscosity or leveling properties of the semiconductor ink.

The cross-sectional shape of the disconnection pattern 17 may be a protruding shape as shown in FIG. 7, or may be a recessed shape provided with two apexes 19 as shown in FIG. 8. Further, as shown in FIG. 9, the shape having the apex 19 at a position other than a center in the width direction of the cross-sectional shape can more easily disconnect the semiconductor pattern 16.

Figure 10A:
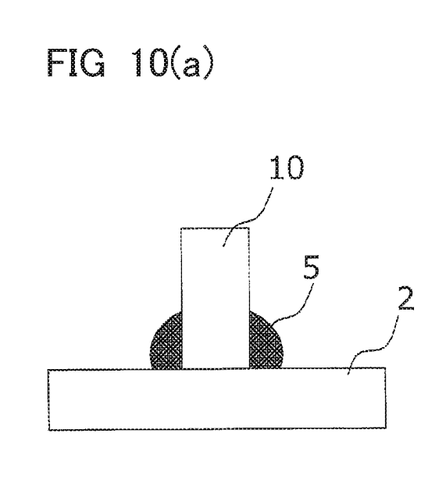
FIGS. 10(a)-10(c) are diagrams illustrating movement of a printed product in relief printing.
Figure 10B:
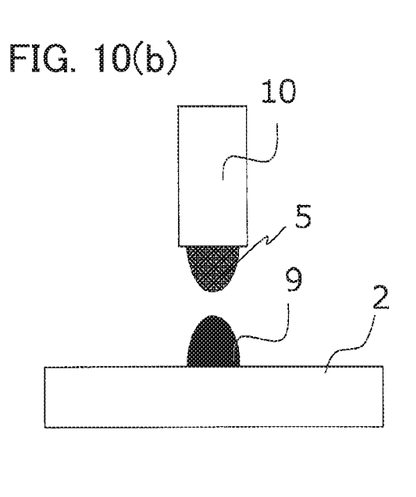
Figure 10C:
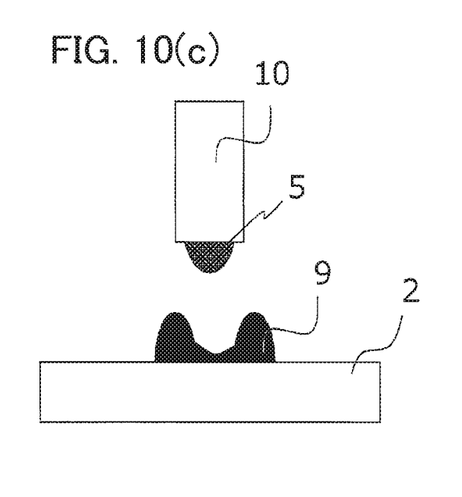

A relief printing method can be used as one of the methods for forming the aforementioned cross-sectional shapes. FIGS. 10(a)-10(c) illustrate a shape change of the printing ink in relief printing. First, ink 5 of a projection 10 of the relief plate 8 shown in FIG. 11 is pressed against the substrate 2 (FIG. 10(a)). Then, the projection 10 is separated from the substrate 2 to thereby allow the ink 5 to be separately transferred to the projection 10 and the substrate 2 so that a printed product 9 is formed as shown in FIG. 10(b) when a solvent in the ink is dried. Printing speed, environment, dry state, and the like can be adjusted to form the printed product 9 as shown in FIG. 10(c) by maintaining the state as shown in FIG. 10(a).

Materials used for the insulating substrate 11 are not specifically limited, and glass substrates and silicon wafers may often be used. When a flexible transistor is desired, a flexible substrate should be used. In such a case, plastic materials such as polyethylene terephthalate (PET), polyimide, polyethersulfone (PES), polyethylene naphthalate (PEN), and polycarbonate are typically used. Since the strength and heat resistance vary depending on the material, a material suited for each production process is preferably used.

Materials used for electrodes such as the gate electrode 13, the source electrode 14, and the drain electrode 15 are not specifically limited. Typically, metals such as gold, platinum, silver, and nickel, oxide films, and conductive polymers can be used. Further, methods for producing the respective electrodes are not specifically limited, and a dry process such as vapor deposition and sputtering or wet process such as coating and printing can also be used in view of the effect on other layers.

Materials used for the gate insulating film 12 are not specifically limited, and any material can be used as long as it performs a sufficient function as the gate insulating film 12. Typically, polyvinyl phenol, polymethyl methacrylate, polyimide, polyvinyl alcohol, epoxy resins, PET, PEN, PES, and the like can also be used.

Materials used for the semiconductor pattern 16 are not specifically limited, and materials typically used as an organic semiconductor material include high molecular-weight materials such as polythiophene, polyallylamine, fluorene-bithiophene copolymer and derivatives thereof, and low molecular-weight materials such as pentacene, tetracene, copper phthalocyanine, perylene and derivatives thereof.

As described above, according to the present invention, the organic thin film transistor array 301, which has the disconnection pattern 17 extending over the plurality of thin film transistor elements 300, ensures that the semiconductor pattern 16 is disconnected by each of the thin film transistor elements 300 even if the semiconductor pattern 16 is formed in a stripe shape extending over the plurality of thin film transistor elements 300. Accordingly, the respective thin film transistor elements 300 can be electrically separated from each other. The elements thus formed have a high on/off ratio and stable transistor properties. Further, since the patterning methods for the semiconductor pattern 16 and the disconnection pattern 17 are relatively easy, the organic thin film transistor array 301 can be produced with high throughput.

EXAMPLES

Example 1

In preparation of the thin film transistor array 301, glass was used as the insulating substrate 11. In the thin film transistor array 301, thin film transistor elements 300 were arranged in a 100×100 matrix at equal intervals.

Fabrication of the thin film transistor element 300 is described below. Silver ink was printed on the insulating substrate 11 made of a glass, and dried on a hotplate at 180° C. for 1 hour to thereby form the gate electrode 13 with 100 nm film thickness and the capacitor electrode.

Subsequently, polyvinyl phenol was applied by spin coating, and dried on a hotplate at 180° C. for 1 hour to thereby form the gate insulating film 12.

Silver ink was printed on the gate insulating film 12, and dried on a hotplate at 180° C. for 1 hour to thereby form the source electrode 14 and the drain electrode 15 with 100 nm film thickness, defining a channel region.

Paste of an epoxy resin material was formed as the disconnection pattern 17 by flexographic printing. For the flexographic printing, a printing machine shown in FIG. 11 was used. The printing was followed by drying on a hotplate at 200° C. for 1 hour. Printing speed was adjusted to adjust the cross-sectional shape of the disconnection pattern 17. The disconnection pattern 17 thus formed had a film thickness of 3000 nm. The cross-sectional shape of the disconnection pattern 17 was a recessed shape as shown in FIG. 8, in which the angle of one of the apexes, formed between virtual lines connecting the apex and each of the inflection points closest to the apex on both sides of the apex, was approximately 70°, and the angle of the other of the apexes was 65°. The surface energy of the epoxy resin material used was 30.9 mN/m.

Semiconductor ink, in which TIPS pentacene was adjusted to 1.0 wt. % by tetralin, was used as a semiconductor material for printing by a flexographic printing method to thereby form the semiconductor pattern 16. For the flexographic printing, a printing machine shown in FIG. 11 was used. A plate on which stripe shaped projections of a photosensitive resin were formed was used as a relief plate. The semiconductor material was printed in a stripe shape having a film thickness of 55 nm in a direction perpendicular to the disconnection pattern 17 while extending over the channel region 16' of the plurality of thin film transistor elements 300. The printing was followed by drying by using an oven at 150° C. for 1 hour at 1 to 4 hPa. In the thin film transistor array 301, each stripe of the semiconductor pattern 16 was printed to extend over 100 pieces of the thin film transistor elements 300, and 100 rows of the semiconductor patterns 16 were arranged.

A fluororesin, which is a fluorine-containing compound, was used as a protective layer material, and the protective layer was formed by flexographic printing. For the flexographic printing, a printing machine shown in FIG. 11 was used. A plate on which stripe shaped projections of a photosensitive resin were formed was used as a relief plate, and printing was performed so that the protective layer covers the entire surface of the semiconductor layer. The printing was followed by drying on a hotplate at 150° C. for 1 hour.

A paste of the epoxy resin material was used as a material for an interlayer insulating film, and spin coating and photolithography were performed.

A silver paste was used to form an upper pixel electrode by screen printing.

Example 2

Example 2 was the same as Example 1 except that the disconnection pattern 17 was printed at a film thickness of 1500 nm.

Example 3

Example 3 was the same as Example 1 except that the disconnection pattern 17 was printed at a film thickness of 200 nm.

Comparative Example 1

Comparative example 1 was the same as Example 1 except that the step of forming the disconnection pattern 17 was not performed.

Comparative Example 2

Comparative example 2 was the same as Example 1 except that the film thickness of the disconnection pattern 17 was 3300 nm.

Comparative Example 3

Comparative example 3 was the same as Example 1 except that the film thickness of the disconnection pattern 17 was 150 nm.

Comparative Example 4

Comparative example 4 was the same as Example 1 except that the surface energy of the epoxy resin material used for the disconnection pattern 17 was 28.5 mN/m.

EVALUATION

From the thin film transistor elements 200 and 300 in the thin film transistor arrays 201 and 301 according to Examples 1 to 3 and Comparative examples 1 to 4, 100 pieces were randomly selected, and their transistor properties were measured. The measured on-current value and on/off ratio were compared.

For Example 1, Example 2, and Example 3, the on/off ratio of the elements was good, and distribution in the array was stable. For Comparative example 1, the on/off ratio of the elements was poor compared with Example 1. For Comparative example 2, Comparative example 3, and Comparative example 4, the on/off ratio of some elements in the array was poor compared with the elements of Example 1. Further, the semiconductor layer was not formed in some elements in the array of Comparative example 2, and measurement of properties of such elements failed.

From the above results, it was found that, according to the method for producing the thin film transistor array of the present invention, a thin film transistor array having high on/off ratio and stable transistor properties was obtained.

The present application addresses the following. In the thin film transistor array in which a plurality of transistor elements are arranged, the semiconductor material, when formed extending over a plurality of channels, causes an electric current to flow through the semiconductors between transistor elements or between a transistor and a pixel electrode, leading to an increase in current value during an off state and a decrease in on/off ratio.

Further, if the source electrode and the drain electrode of the same element are formed in the semiconductor layer outside the channel region, an unintended region may serve as a channel. As a consequence, an area for forming the source electrode and the drain electrode is reduced, which causes a decrease in the design freedom for electrodes.

Accordingly, it has been proposed to form a semiconductor layer only at a desired position by using an ink-jetting method for separating elements (see PTL 3). However, in the ink-jetting method using an organic semiconductor material, which often has poor solubility in a solvent, material deposited at a position adjacent to the nozzle often causes an ejection failure. In addition, since the printing is performed for each of the elements, deterioration of throughput is inevitable.

Further, for formation of the semiconductor layer in a stripe shape, methods for producing a transistor element having high on/off ratio have been developed, in which transistors are formed by providing a liquid repellent layer between the respective elements, and then forming a semiconductor layer thereon in a stripe shape (see PTL 4). However, there are problems such as that the liquid repellent material needs to be selected or the liquid repellency needs to be adjusted depending on the semiconductor ink to be used, and too strong liquid repellency may disturb formation of further upper layers.

The present invention has an aspect to provide a structure of a thin film transistor array having high design freedom for electrodes, high on/off ratio, and stable transistor properties, and a method for producing the thin film transistor array with high throughput.

An aspect of the invention for solving the above issues is a thin film transistor array including: a plurality of thin film transistor elements which include an insulating substrate, a gate electrode, a gate insulating film, a source electrode, a drain electrode, and a channel region formed between the source electrode and the drain electrode, the thin film transistor elements being arrayed in a matrix; a disconnection pattern made of an insulating material and formed in a stripe shape extending over the plurality of thin film transistor elements; and a semiconductor pattern formed in a stripe shape perpendicular to the disconnection pattern while extending over the channel regions of the plurality of thin film transistor elements, the semiconductor pattern being disconnected at an intersection with the disconnection pattern, wherein the disconnection pattern has a maximum film thickness in a range of 200 nm or more and 3000 nm or less.

Furthermore, the disconnection pattern may have one or more apexes in a cross section perpendicular to an extending direction of the disconnection pattern.

Furthermore, the disconnection pattern may have two or more apexes in a cross section perpendicular to an extending direction of the disconnection pattern.

Furthermore, the disconnection pattern may have one apex in a cross section perpendicular to an extending direction of the disconnection pattern at a position other than a center in a width direction of the disconnection pattern.

Furthermore, in the disconnection pattern, an angle of the apex formed between two inflection points closest to the apex on both sides of the apex in a cross section perpendicular to an extending direction of the disconnection pattern may be in a range of 100° or less.

Furthermore, an insulating material used for the disconnection pattern may have a surface energy of 30 mN/m or more.

Furthermore, another aspect of the present invention is a method for producing the thin film transistor array described above, including the steps of: forming at least the gate electrode, the gate insulating film, the source electrode, and the drain electrode on the insulating substrate; forming a plurality of disconnection patterns by printing an insulating material in a stripe shape on the gate insulating film, the source electrode, and the drain electrode; and forming a plurality of semiconductor patterns by printing in a stripe shape perpendicular to the disconnection patterns, wherein, in the step of forming the plurality of semiconductor patterns, the semiconductor patterns are disconnected at positions perpendicular to the disconnection patterns.

According to an embodiment of the present invention, a structure of a thin film transistor array having high design freedom for electrodes, high on/off ratio, and stable transistor properties, and a method for producing the thin film transistor array with high throughput can be provided.

INDUSTRIAL APPLICABILITY

The embodiments of present invention are useful for production of thin film transistor arrays having high design freedom for electrodes, high on/off ratio, and stable transistor properties with high throughput.

REFERENCE SIGNS LIST

1: stage
2: substrate
3: ink chamber
4: doctor blade
5: ink
6: anilox roll
7: plate cylinder
8: relief plate
9: printed product
10: projection
100, 200, 300: thin film transistor element
101, 201, 301: thin film transistor array
11: insulating substrate
12: gate insulating layer
13: gate electrode
14: source electrode
15: drain electrode
16: semiconductor layer, semiconductor pattern
17: disconnection pattern
18: drain electrode hidden by disconnection pattern
19: apex
20: inflection point Obviously, numerous modifications and variations of the present invention are possible in light of the above teachings. It is therefore to be understood that within the scope of the appended claims, the invention may be practiced otherwise than as specifically described herein.

What is claimed is:

1. A thin film transistor array, comprising:
  a plurality of thin film transistor elements including an insulating substrate, a gate electrode, a gate insulating film, a source electrode, a drain electrode, and a channel region formed between the source electrode and the drain electrode, the thin film transistor elements being arrayed in a matrix;
  a disconnection pattern comprising an insulating material and formed in stripes extending over the thin film transistor elements, the disconnection pattern having a maximum film thickness of 200 nm-3000 nm; and
  a semiconductor pattern formed in stripes perpendicular to the disconnection pattern and extending over the channel region of the thin film transistor elements, the semiconductor pattern being disconnected at an intersection with the disconnection pattern.

2. The thin film transistor array according to claim 1, wherein the disconnection pattern has at least one apex in a cross section perpendicular to an extending direction of the disconnection pattern.

3. The thin film transistor array according to claim 2, wherein the at least one apex comprises a plurality of apexes in the cross section.

4. The thin film transistor array according to claim 2, wherein the disconnection pattern has one apex in the cross section at a position other than a center in a width direction of the disconnection pattern.

5. The thin film transistor array according to claim 2, wherein the disconnection pattern is formed such that the apex formed between two inflection points closest to the apex on both sides of the apex in the cross section has an angle of 100° or less.

6. The thin film transistor array according to claim 3, wherein the disconnection pattern is formed such that the apex formed between two inflection points closest to the apex on both sides of the apex in the cross section has an angle of 100° or less.

7. The thin film transistor array according to claim 4, wherein the disconnection pattern is formed such that the apex formed between two inflection points closest to the apex on both sides of the apex in the cross section has an angle of 100° or less.

8. The thin film transistor array according to claim 1, wherein the insulating material has a surface energy of 30 mN/m or more.

9. The thin film transistor array according to claim 2, wherein the insulating material has a surface energy of 30 mN/m or more.

10. The thin film transistor array according to claim 3, wherein the insulating material has a surface energy of 30 mN/m or more.

11. The thin film transistor array according to claim 4, wherein the insulating material has a surface energy of 30 mN/m or more.

12. The thin film transistor array according to claim 5, wherein the insulating material has a surface energy of 30 mN/m or more.

13. A method for producing the thin film transistor array of claim 1, comprising:
    forming the gate electrode, the gate insulating film, the source electrode, and the drain electrode on the insulating substrate such that the channel region is formed between the source and drain electrodes, and that the thin film transistor elements are arrayed in the matrix;
    printing the insulating material in stripes on the gate insulating film, the source electrode, and the drain electrode such that the disconnection pattern is formed; and
    printing the semiconductor pattern in stripes perpendicular to the disconnection pattern such that the semiconductor pattern is disconnected at positions perpendicular to the disconnection pattern.

14. The method according to claim 13, wherein the disconnection pattern is printed such that the disconnection pattern has at least one apex in a cross section perpendicular to an extending direction of the disconnection pattern.

15. The method according to claim 14, wherein the disconnection pattern is printed such that the at least one apex comprises a plurality of apexes in the cross section.

16. The method according to claim 13, wherein the disconnection pattern is printed such that the disconnection pattern has one apex in the cross section at a position other than a center in a width direction of the disconnection pattern.

17. The method according to claim 14, wherein the disconnection pattern is printed such that the apex formed between two inflection points closest to the apex on both sides of the apex in the cross section has an angle of 100° or less.

18. The method according to claim 13, wherein the insulating material has a surface energy of 30 mN/m or more.

* * * * *